(12) United States Patent
Chen et al.

(10) Patent No.: US 12,038,156 B2
(45) Date of Patent: Jul. 16, 2024

(54) LIGHT SOURCE MODULE

(71) Applicant: Lextar Electronics Corporation, Hsinchu (TW)

(72) Inventors: Shu-Wei Chen, Hsinchu (TW); Jia-Jhang Kuo, Hsinchu (TW); Ching-Chi Chiang, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 18/203,984

(22) Filed: May 31, 2023

(65) Prior Publication Data
US 2023/0400171 A1    Dec. 14, 2023

(30) Foreign Application Priority Data
Jun. 8, 2022  (TW) .................................. 111121167

(51) Int. Cl.
*F21V 19/00*    (2006.01)
*F21V 3/02*     (2006.01)
*F21V 7/00*     (2006.01)
*F21V 17/10*    (2006.01)

(52) U.S. Cl.
CPC ............ *F21V 19/0065* (2013.01); *F21V 3/02* (2013.01); *F21V 7/0058* (2013.01); *F21V 17/101* (2013.01)

(58) Field of Classification Search
CPC ...... F21V 19/0065; F21V 3/02; F21V 7/0058; F21V 17/101
See application file for complete search history.

(56) References Cited

U.S. PATENT DOCUMENTS

| | | | | |
|---|---|---|---|---|
| 7,781,787 | B2 * | 8/2010 | Suehiro | F21V 5/10 |
| | | | | 257/E33.059 |
| 7,837,370 | B2 * | 11/2010 | Bierhuizen | G02B 19/0071 |
| | | | | 362/555 |
| 8,648,358 | B2 * | 2/2014 | Ito | H01L 33/54 |
| | | | | 257/E33.059 |
| 9,230,943 | B2 * | 1/2016 | Harbers | F21K 9/62 |
| 9,341,321 | B2 * | 5/2016 | Hand | F21V 13/02 |
| 10,520,163 | B2 * | 12/2019 | Shinohara | F21V 7/24 |
| 2002/0185651 | A1 | 12/2002 | Sommers | |

FOREIGN PATENT DOCUMENTS

| | | |
|---|---|---|
| CN | 202024287 U | 11/2011 |
| TW | M588205 U | 12/2019 |
| TW | M605267 U | 12/2020 |

\* cited by examiner

*Primary Examiner* — Arman B Fallahkhair
(74) *Attorney, Agent, or Firm* — Patterson + Sheridan, LLP

(57) ABSTRACT

A light source module is provided. The light source module includes a lead frame, a light source, a cup part, and a reflector. The light source is disposed on the lead frame, wherein the light source provides a light. The cup part is disposed on the lead frame, wherein the cup part includes an opening, a plurality of thick-wall portions and a plurality of thin-wall portions. The thick-wall portions and the thin-wall portions surround the light source and define a space. The reflector covers the opening. At least a portion of the light is reflected by the reflector, and is emitted through the thick-wall portions and the thin-wall portions.

21 Claims, 2 Drawing Sheets

LIGHT SOURCE MODULE

CROSS REFERENCE TO RELATED APPLICATIONS

This application claims priority of Taiwan Patent Application No. 111121167, filed on Jun. 8, 2022, the entirety of which is incorporated by reference herein.

BACKGROUND OF THE DISCLOSURE

Field of the Disclosure

The present disclosure relates to a light source module, and, in particular, to a light source module with improved light extraction efficiency.

Description of the Related Art

A conventional light source module comprises an LED element, a lead frame, and a cup part. The cup part is affixed to the lead frame. The cup part defines a space. The LED element is disposed in the space. In order to firmly combine the cup part with the lead frame, the thickness of the base portion of the cup part is increased. However, since the light transmittance of the cup part is inversely proportional to its thickness, the base portion of the cup part reduces the overall light extraction efficiency of the light source module.

BRIEF SUMMARY OF THE DISCLOSURE

An embodiment of the present disclosure provides a light source module. The light source module comprises a lead frame, a light source, a cup part, and a reflector. The light source is disposed on the lead frame, wherein the light source provides a light. The cup part is disposed on the lead frame, wherein the cup part comprises an opening, a plurality of thick-wall portions and a plurality of thin-wall portions, the thick-wall portions and the thin-wall portions surround the light source and define a space. The reflector covers the opening. At least a portion of the light is reflected by the reflector, and is emitted through the thick-wall portions and the thin-wall portions.

In the light source module of the embodiment of the disclosure, the thin-wall portions are utilized to improve the light extraction efficiency of the light source module, and the thick-wall portions are utilized to maintain the structural strength of the cup part. In one embodiment, the thick-wall portions and the thin-wall portions are configured in a staggered manner. The structural strength of the cup part is maintained, and the luminous uniformity of the light source module is improved.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

The following description is made for the purpose of illustrating the general principles of the disclosure and should not be taken in a limiting sense. The scope of the disclosure is best determined by reference to the appended claims.

Figure 1A:
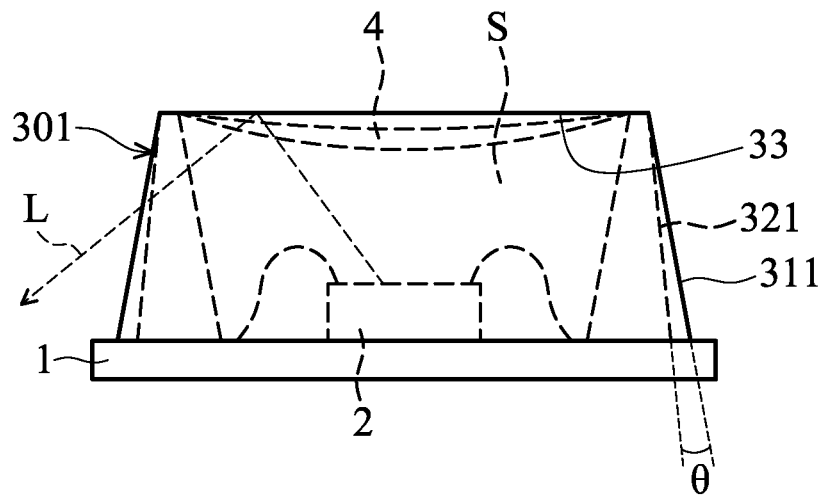
FIG. 1A is a side view of a light source module of a first embodiment of the disclosure.
Figure 1B:
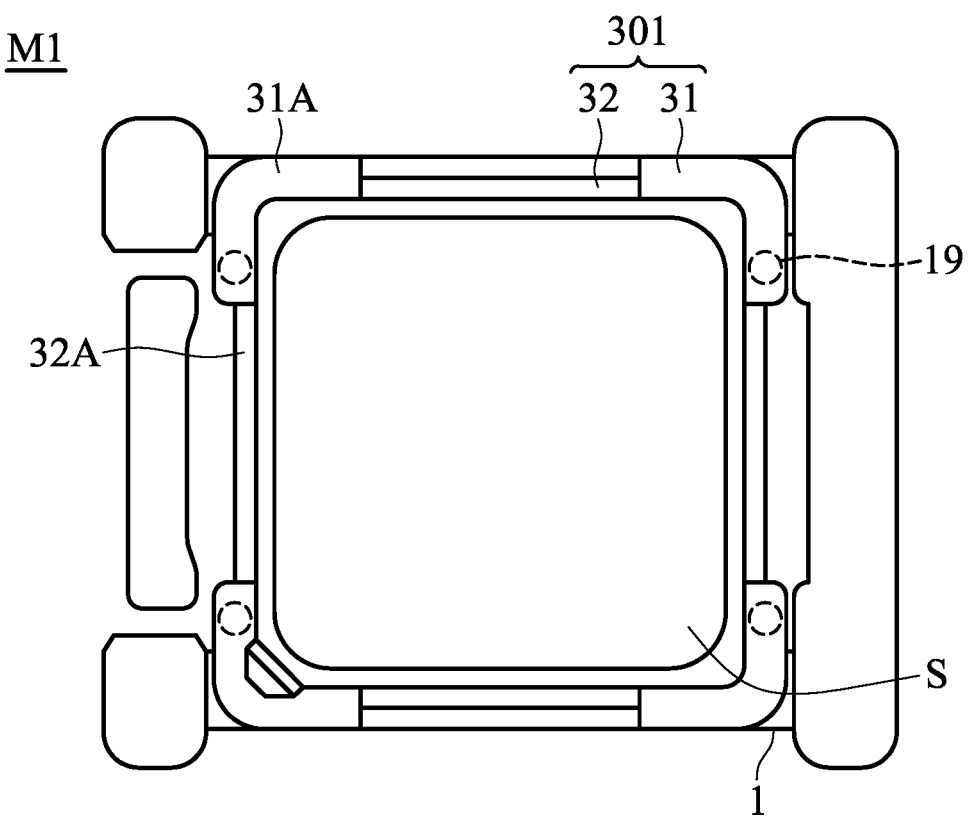
FIG. 1B is a top view of a portion of the light source module of the first embodiment of the disclosure.

FIG. 1A is a side view of a light source module of a first embodiment of the disclosure. FIG. 1B is a top view of a portion of the light source module of the first embodiment of the disclosure. With reference to FIGS. 1A and 1B, the light source module M1 of the first embodiment of the disclosure comprises a lead frame 1, a light source 2, a cup part 301 and a reflector 4. The light source 2 is disposed on the lead frame 1. The light source 2 of the light source module M1 provides a light L. The cup part 301 is disposed on the lead frame 1. The cup part 301 comprises an opening 33, a plurality of thick-wall portions 31 and a plurality of thin-wall portions 32. The thick-wall portions 31 and the thin-wall portions 32 surround the light source 2 and define a space S. The reflector 4 covers the opening 33. At least a portion of the light L is reflected by the reflector 4, and is emitted through the thick-wall portions 31 and the thin-wall portions 32.

With reference to FIG. 1A, in one embodiment, the light source 2 can be a light-emitting diode element. The disclosure is not meant to restrict the disclosure.

With reference to FIG. 1A, in one embodiment, the cup part 301 can be made of resin, plastic, or other light-transmitting materials.

With reference to FIG. 1A, in one embodiment, lead frame 1 can be made of metal. The disclosure is not meant to restrict the disclosure.

With reference to FIG. 1B, in one embodiment, the shape of the cup part 301 on the orthographic projection plane is rectangular. The thick-wall portions 31 comprise a plurality of bent thick-wall portions 31A. The bent thick-wall portions 31A are configured at the corners of the cup part 301. In this embodiment, the corners of the cup part 301 needs increased structural strength. The bent thick-wall portions 31A are thus utilized to prevent the cup part 301 from being damaged in a demolding process.

With reference to FIG. 1B, in one embodiment, the thin-wall portions 32 comprise a plurality of straight thin-wall portions 32A. On the orthographic projection of the plane, each straight thin-wall portion 32A is located between two of the bent thick-wall portions 31A.

With reference to FIGS. 1A and 1B, in one embodiment, the luminous flux of the thin-wall portions 32 is greater than the luminous flux of the thick-wall portions 31 when the light L passes through the cup part 301. Therefore, the light extraction efficiency of the light source module is improved.

With reference to FIGS. 1A and 1B, in this embodiment, the thick-wall portions 31 and the thin-wall portions 32 are configured in a staggered manner. The structural strength of the cup part 301 is maintained, and the luminous uniformity of the light source module is improved.

With reference to FIG. 1B, in one embodiment, the lead frame 1 comprises a plurality of glue-fix holes 19. The glue-fix holes 19 are configured under the bent thick-wall portions 31A. The bent thick-wall portions 31A are combined with the glue-fix holes 19, and the cup part 301 is thus firmly connected with the lead frame 1.

With reference to FIG. 1A, in one embodiment, at least a portion of the reflector 4 is received in the space S.

With reference to FIG. 1A, in one embodiment, each thick-wall portion 31 comprises a first inclined surface 311. Each thin-wall portion 32 comprises a second inclined surface 321. The slope of the second inclined surface 321 relative to the lead frame 1 is greater than the slope of the first inclined surface 311 relative to the lead frame 1.

With reference to FIG. 1A, in one embodiment, on a lateral projection plane, an included angle θ is formed between the first inclined surface 311 and the second inclined surface 321. The included angle θ is between 2°~13°. In another embodiment, the included angle θ can be between 5°~10°. Through the proper design of the included angle θ, a balance is achieved between the light extraction efficiency and the structural strength of the cup part 301.

With reference to FIGS. 1A and 1B, in one embodiment, the light transmittance of the material of the cup part 301 is between 15%~35%. In another embodiment, the light transmittance of the material of the cup part is between 22%~30%.

Figure 2A:
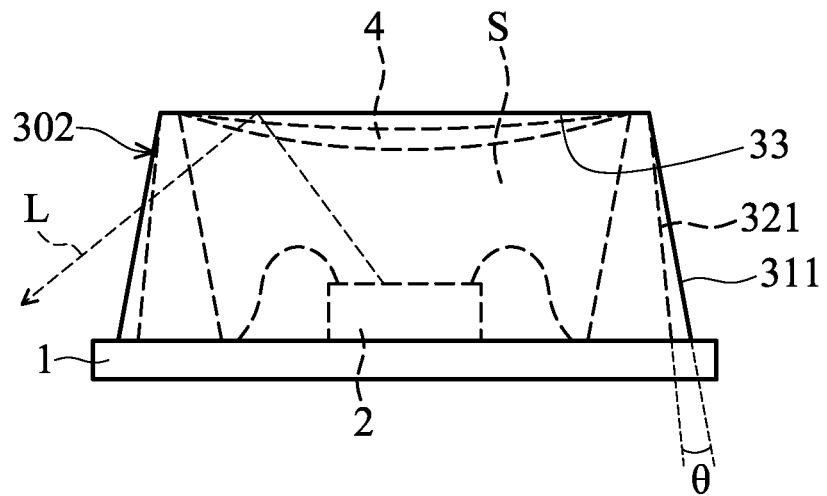
FIG. 2A is a side view of a light source module of a second embodiment of the disclosure.
Figure 2B:
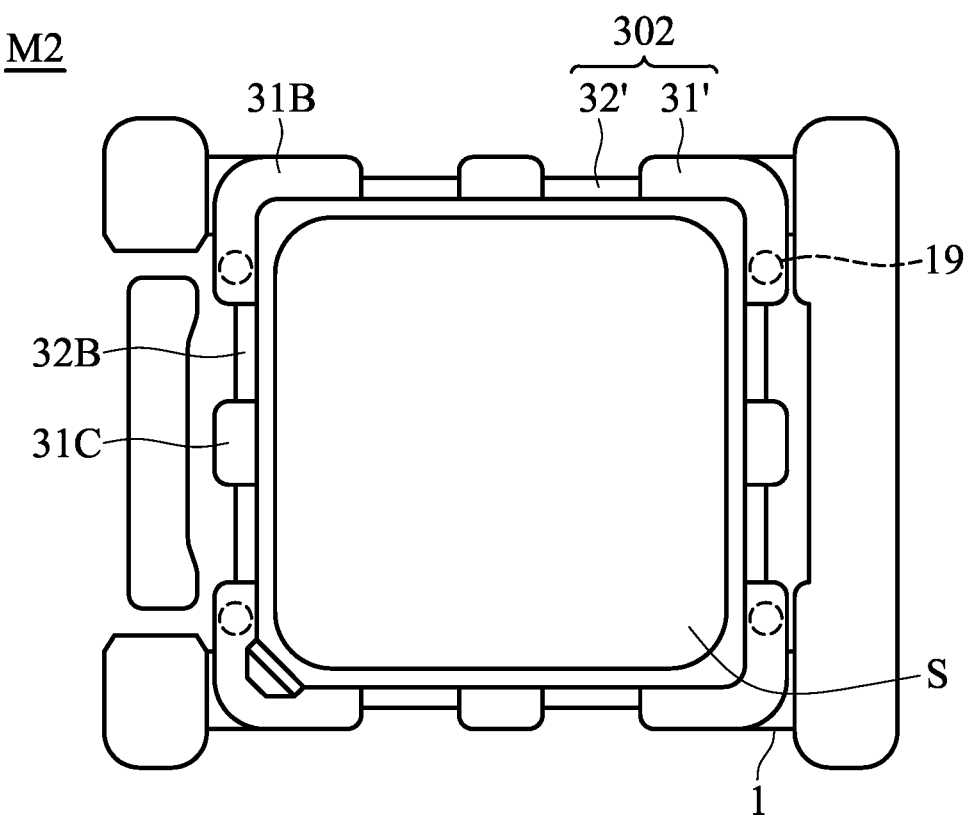
FIG. 2B is a top view of a portion of the light source module of the second embodiment of the disclosure.

FIG. 2A is a side view of a light source module of a second embodiment of the disclosure. FIG. 2B is a top view of a portion of the light source module of the second embodiment of the disclosure. With reference to FIGS. 2A and 2B, the light source module M2 of the second embodiment of the disclosure comprises a lead frame 1, a light source 2, a cup part 302 and a reflector 4. The light source 2 is disposed on the lead frame 1. The light source 2 of the light source module M2 provides a light L. The cup part 302 is disposed on the lead frame 1. The cup part 302 comprises an opening 33, a plurality of thick-wall portions 31' and a plurality of thin-wall portions 32'. The thick-wall portions 31' and the thin-wall portions 32' surround the light source 2 and define a space S. The reflector 4 covers the opening 33. At least a portion of the light L is reflected by the reflector 4, and is emitted through the thick-wall portions 31' and the thin-wall portions 32'.

With reference to FIG. 2B, in one embodiment, the shape of the cup part 302 on the orthographic projection plane is rectangular. The thick-wall portions 31' comprise a plurality of bent thick-wall portions 31B. The bent thick-wall portions 31B are configured at the corners of the cup part 302. In this embodiment, the corners of the cup part 302 needs increased structural strength. The bent thick-wall portions 31B are thus utilized to prevent the cup part 302 from being damaged in a demolding process.

With reference to FIG. 2B, in one embodiment, the thin-wall portions 32' comprise a plurality of straight thin-wall portions 32B. On the top projection plane, each straight thin-wall portion 32B is located between two of the bent thick-wall portions 31B.

With reference to FIG. 2B, in one embodiment, the thick-wall portions 31' further comprise a plurality of straight thick-wall portions 31C. Each straight thick-wall portion 31C is located between two of the straight thin-wall portions 32B. In this embodiment, the straight thick-wall portions 31C are utilized to maintain the strength of the cup part 302 and to prevent the cup part 302 from being damaged in the demolding process.

With reference to FIGS. 2A and 2B, in one embodiment, the luminous flux of the thin-wall portions 32' is greater than the luminous flux of the thick-wall portions 31' when the light L passes through the cup part 302. Therefore, the light extraction efficiency of the light source module is improved.

With reference to FIGS. 2A and 2B, in this embodiment, the thick-wall portions 31' and the thin-wall portions 32' are configured in a staggered manner. The structural strength of the cup part 302 is maintained, and the luminous uniformity of the light source module is improved.

With reference to FIG. 2B, in one embodiment, the lead frame 1 comprises a plurality of glue-fix holes 19. The glue-fix holes 19 are configured under the bent thick-wall portions 31B. The bent thick-wall portions 31B are combined with the glue-fix holes 19, and the cup part 302 is thus firmly connected with the lead frame 1.

With reference to FIG. 2A, in one embodiment, at least a portion of the reflector 4 is embedded in the space S.

With reference to FIG. 2A, in one embodiment, each thick-wall portion 31' comprises a first inclined surface 311. Each thin-wall portion 32' comprises a second inclined surface 321. The slope of the second inclined surface 321 relative to the lead frame 1 is greater than the slope of the first inclined surface 311 relative to the lead frame 1.

With reference to FIG. 2A, in one embodiment, on a lateral projection plane, an included angle θ is formed between the first inclined surface 311 and the second inclined surface 321. The included angle θ is between 2°~13°. In another embodiment, the included angle θ can be between 5°~10°. Through the proper design of the included angle θ, a balance is achieved between the light extraction efficiency and the structural strength of the cup part 302.

With reference to FIGS. 2A and 2B, in one embodiment, the light transmittance of the material of the cup part 302 is between 15%~35%. In another embodiment, the light transmittance of the material of the cup part is between 22%~30%.

In the light source module of the embodiment of the disclosure, the thin-wall portions are utilized to improve the light extraction efficiency of the light source module, and the thick-wall portions are utilized to maintain the structural strength of the cup part. In one embodiment, the thick-wall portions and the thin-wall portions are configured in a staggered manner. The structural strength of the cup part is maintained, and the luminous uniformity of the light source module is improved.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light source module, comprising:
   a lead frame;
   a light source, disposed on the lead frame, wherein the light source provides a light;
   a cup part, disposed on the lead frame, wherein the cup part comprises an opening, a plurality of thick-wall portions and a plurality of thin-wall portions, the thick-wall portions and the thin-wall portions surround the light source to define a space; and
   a reflector, covering the opening, wherein at least a portion of the light is reflected by the reflector and is emitted through the thick-wall portions and the thin-wall portions,
   wherein the shape of the cup part on the orthographic projection plane is rectangular, the thick-wall portions comprise a plurality of bent thick-wall portions, and the bent thick-wall portions are configured at corners of the cup part, wherein the thin-wall portions comprise a plurality of straight thin-wall portions, and each straight thin-wall portion is located between two of the bent thick-wall portions, wherein the thick-wall portions further comprise a plurality of straight thick-wall portions, and each straight thick-wall portion is located between two of the straight thin-wall portions.

2. The light source module as claimed in claim 1, wherein each thick-wall portion comprises a first inclined surface, each thin-wall portion comprises a second inclined surface, and a slope of the second inclined surface relative to the lead frame is greater than a slope of the first inclined surface relative to the lead frame.

3. The light source module as claimed in claim 2, wherein on a lateral projection plane, an included angle is formed between the first inclined surface and the second inclined surface, and the included angle is between 2° ~13°.

4. The light source module as claimed in claim 3, wherein the included angle is between 5° ~10°.

5. The light source module as claimed in claim 1, wherein a light transmittance of a material of the cup part is between 15%~35%.

6. The light source module as claimed in claim 5, wherein the light transmittance of the material of the cup part is between 22%~30%.

7. The light source module as claimed in claim 1, wherein the lead frame comprises a plurality of glue-fix holes, and the glue-fix holes are configured under the bent thick-wall portions.

8. The light source module as claimed in claim 1, wherein at least a portion of the reflector is embedded in the space.

9. The light source module as claimed in claim 1, wherein the thick-wall portions and the thin-wall portions are configured in a staggered manner.

10. The light source module as claimed in claim 1, wherein a luminous flux of the thin-wall portions is greater than a luminous flux of the thick-wall portions when the light passes through the cup part.

11. A light source module, comprising:
a lead frame;
a light source, disposed on the lead frame, wherein the light source provides a light;
a cup part, disposed on the lead frame, wherein the cup part comprises an opening, a plurality of thick-wall portions and a plurality of thin-wall portions, the thick-wall portions and the thin-wall portions surround the light source to define a space; and
a reflector, covering the opening, wherein at least a portion of the light is reflected by the reflector and is emitted through the thick-wall portions and the thin-wall portions, wherein each thick-wall portion comprises a first inclined surface, each thin-wall portion comprises a second inclined surface, and a slope of the second inclined surface relative to the lead frame is greater than a slope of the first inclined surface relative to the lead frame, and wherein on a lateral projection plane, an included angle is formed between the first inclined surface and the second inclined surface, and the included angle is between 2° ~13°.

12. The light source module as claimed in claim 11, wherein the shape of the cup part on the orthographic projection plane is rectangular, the thick-wall portions comprise a plurality of bent thick-wall portions, and the bent thick-wall portions are configured at corners of the cup part.

13. The light source module as claimed in claim 12, wherein the thin-wall portions comprise a plurality of straight thin-wall portions, and each straight thin-wall portion is located between two of the bent thick-wall portions.

14. The light source module as claimed in claim 13, wherein the thick-wall portions further comprise a plurality of straight thick-wall portions, and each straight thick-wall portion is located between two of the straight thin-wall portions.

15. The light source module as claimed in claim 12, wherein the lead frame comprises a plurality of glue-fix holes, and the glue-fix holes are configured under the bent thick-wall portions.

16. The light source module as claimed in claim 11, wherein a light transmittance of a material of the cup part is between 15%~35%.

17. The light source module as claimed in claim 16, wherein the light transmittance of the material of the cup part is between 22%~30%.

18. The light source module as claimed in claim 11, wherein the included angle is between 5° ~10°.

19. The light source module as claimed in claim 11, wherein at least a portion of the reflector is embedded in the space.

20. The light source module as claimed in claim 11, wherein the thick-wall portions and the thin-wall portions are configured in a staggered manner.

21. The light source module as claimed in claim 11, wherein a luminous flux of the thin-wall portions is greater than a luminous flux of the thick-wall portions when the light passes through the cup part.

* * * * *